(12) United States Patent
Inoue et al.

(10) Patent No.: US 7,847,534 B2
(45) Date of Patent: Dec. 7, 2010

(54) REFERENCE CURRENT CIRCUIT

(75) Inventors: Atsuo Inoue, Kyoto (JP); Noriaki Matsuno, Hyogo (JP)

(73) Assignee: Panasonic Corporation, Osaka (JP)

( * ) Notice: Subject to any disclaimer, the term of this patent is extended or adjusted under 35 U.S.C. 154(b) by 133 days.

(21) Appl. No.: 12/055,784

(22) Filed: Mar. 26, 2008

(65) Prior Publication Data
US 2008/0252282 A1 Oct. 16, 2008

(30) Foreign Application Priority Data

Mar. 26, 2007 (JP) .............................. 2007-078510
Jan. 28, 2008 (JP) .............................. 2008-016370

(51) Int. Cl.
*G05F 3/26* (2006.01)
*G05F 3/28* (2006.01)

(52) U.S. Cl. ..................................... 323/316
(58) Field of Classification Search ................. 323/311, 323/312, 313, 314, 315, 316; 327/539
See application file for complete search history.

(56) References Cited

U.S. PATENT DOCUMENTS

| | | | |
|---|---|---|---|
| 4,825,145 A * | 4/1989 | Tanaka et al. | 323/315 |
| 5,254,938 A | 10/1993 | Ito | |
| 5,434,533 A | 7/1995 | Furutani | |
| 6,968,249 B2 * | 11/2005 | Nishino et al. | 700/108 |
| 7,285,943 B2 * | 10/2007 | Migliavacca | 323/277 |
| 7,508,184 B2 * | 3/2009 | Yen et al. | 323/314 |
| 7,579,813 B2 * | 8/2009 | Fan | 323/231 |

FOREIGN PATENT DOCUMENTS

JP 2809927 7/1998

OTHER PUBLICATIONS

Watanabe, Kajiro, et al., "Fundamentals of Analogue LSI Design," Ohmsha, 2006, pp. 149-215, with verification from translator Yukiko Hirama.

* cited by examiner

*Primary Examiner*—Gary L Laxton
(74) *Attorney, Agent, or Firm*—McDermott Will & Emery LLP

(57) ABSTRACT

Provided is a reference current circuit able to reduce temperature dependence of the reference current even in a case of using a resistor with extremely low temperature-dependent resistance. The reference current circuit comprises a non-inverting amplifier circuit 110 receiving a temperature-compensated reference voltage $V_{BG}$ and generating a voltage $V_{out1}$ at an output point; a current source circuit 120 composed of a transistor Q1 connected to the output point via a resistor and a transistor Q2 receiving a voltage equal to a voltage $V_{BE1}$ generated across terminals of Q1 and generating a corresponding current. The circuit 110 (i) includes a third transistor Q3, a voltage $V_{BE3}$ generated across terminals of which has the same temperature characteristic as the voltage $V_{BE1}$, and (ii) is configured such that $V_{out1}$ is a sum of (a) a temperature-compensated voltage component based on $V_{BG}$ and (b) a voltage component equal-to-the voltage $V_{BE3}$.

15 Claims, 6 Drawing Sheets

REFERENCE CURRENT CIRCUIT

BACKGROUND OF THE INVENTION (1) Field of the Invention

The present invention relates to a reference current circuit which generates a bias current provided to an analogue circuit.

(2) Description of the Related Art

FIG. 4 shows a structure of a conventional reference current circuit.

A reference current circuit 400 includes anon-inverting amplifier circuit 410 and a current source circuit 120.

The non-inverting amplifier circuit 410 is composed of an amplifier circuit OP40, a resistor R1, and a resistor R2. The amplifier circuit OP40 includes an inverting input terminal, a non-inverting input terminal, and an output terminal; the resistor R1 is inserted in a wiring connecting the inverting input terminal and a ground terminal; and the resistor R2 is inserted in a wiring connecting the output terminal and the inverting input terminal. The non-inverting input terminal of the amplifier circuit OP 40 receives input of a reference voltage $V_{BG}$ which is independent of a temperature T and a power supply voltage Vdd. In other words, the reference voltage $V_{BG}$ is temperature-compensated.

The current source circuit 120 is composed of a resistor R3, a transistor Q1, and a transistor Q2. One terminal of the resistor R3 is connected to the output terminal of the amplifier circuit OP40; a collector and a base of the transistor Q1 are connected to the other terminal of the resistor R3, while an emitter of the transistor Q1 is grounded; and a base of the transistor Q2 is connected to the collector and the base of the transistor Q1.

In general, a bandgap reference circuit is often used as a reference voltage circuit 500 which outputs the reference voltage $V_{BG}$. FIG. 5 shows one example of such a bandgap reference circuit. The reference voltage circuit 500 is composed of an amplifier circuit OPS, a resistor R1a, a transistor Q1a, a resistor R2a, a resistor R3a, and a transistor Q2a. The resistor R1a is inserted in a wiring connecting an on-inverting input terminal and an output terminal of the amplifier circuit OPS; a base and a collector of the transistor Q1a are grounded; the resistor R2a is inserted in a wiring connecting an inverting input terminal and the output terminal of the amplifier circuit OPS; the resistor R3a is inserted in a wiring connecting the inverting input terminal and an emitter of the transistor Q2a; and a base and a collector of the transistor Q2a are grounded.

In the following, an outline of a principle which generates a reference current with low temperature dependence will be described in relation to the reference current circuit 400 structured as above.

The following equation holds for the non-inverting amplifier circuit 410.

$$V_{BG} = \frac{R_1}{R_1 + R_2} \cdot V_{out4} \quad (4.1)$$

The following equation is derived from the equation (4.1).

$$V_{out4} = \left(1 + \frac{R_2}{R_1}\right) \cdot V_{BG} \quad (4.2)$$

Here, $V_{BG}$ is a reference voltage which is independent of the temperature T and the power supply voltage Vdd; and $R_1$ and $R_2$ are resistances with a positive temperature coefficient. When the temperature is T, the following equations hold.

$$\frac{\partial V_{BG}}{\partial T} = 0, \frac{\partial R_1}{\partial T} = \frac{\partial R_2}{\partial T} > 0$$

Since the ratio of $R_1$ and $R_2$ remains the same regardless of temperature change, the equation (4.2) indicates that an output voltage $V_{out4}$ is temperature-independent.

Also, the following equation can be found for the current source circuit 120.

$$V_{out4} = R_3 \cdot I_{ref4} + V_{BE} \quad (4.3)$$

The equation (4.3) leads to the following equation.

$$I_{ref4} = \frac{V_{out4} - V_{BE}}{R_3} \quad (4.4)$$

By partially differentiating both sides of the equation (4.4) by the temperature T, the following equation can be obtained.

$$\frac{\partial I_{ref4}}{\partial T} = \frac{1}{R_3} \cdot \frac{\partial V_{BE}}{\partial T} - \frac{V_{out4} - V_{BE}}{R_3^2} \cdot \frac{\partial R_3}{\partial T} \quad (4.5)$$

Also, based on the following inequality $$\frac{\partial V_{BE}}{\partial T} < 0$$

and "$V_{out4} > V_{BE}$", in the right side of the equation (4.5), the first term is positive, while the second term is negative. Thus, by adjusting each parameter such that the right side of the equation (4.5) becomes 0, a reference current $I_{ref4}$ with low temperature-dependence is generated. This is how the temperature characteristic of the transistor Q1 is compensated by the temperature characteristic of the resistor R3.

However, in recent years, in the field of semiconductor integrated circuits, temperature dependences of resistances are becoming extremely low as miniaturization of resistors progresses. Also, there are limits to actual adjustment ranges when adjusting each parameter. Thus, with the above-mentioned conventional structure, it is becoming increasingly difficult to reduce temperature dependence of a reference current.

Non-Patent Document 1: Fundamentals of Analogue LSI Design, by Kajiro Watanabe and Tetsuo Nakamura, Ohmsha, 2006, pp. 149-151.

SUMMARY OF THE INVENTION

The present invention was conceived in view of the above problem, and aims to provide a reference current circuit able to reduce temperature dependence of a reference current even in a case where a resistor with an extremely low temperature-dependent resistance value is used.

In order to achieve the above-stated aim, the present invention provides a reference current circuit comprising a voltage generating circuit operable to generate, from a reference voltage which is temperature-compensated, a predetermined voltage at an output point, and a current source circuit including a current mirror composed of (i) a first semiconductor device connected to the output point via a resistor and (ii) a second semiconductor device which, as a result of receiving a voltage equal to a voltage across terminals of the first semiconductor device, generates a current corresponding to the received voltage. Here, the voltage generating circuit (i) includes a third semiconductor device, a voltage across terminals of which has a temperature characteristic identical to the temperature characteristic of the voltage across the terminals of the first semiconductor device, and (ii) is configured such that the predetermined voltage is a sum of (a) a temperature-compensated voltage component which is based on the reference voltage and (b) a voltage component equal to the voltage across the terminals of the third semiconductor device.

According to the above structure, the temperature dependence of the reference current is able to be reduced even in a case where an extremely low temperature-dependent resistor is used.

BRIEF DESCRIPTION OF THE DRAWINGS

These and other objects, advantages and features of the invention will become apparent from the following description thereof taken in conjunction with the accompanying drawings which illustrate a specific embodiment of the invention. In the drawings.

DESCRIPTION OF THE PREFERRED EMBODIMENT

In the following, embodiments of the present invention will be described with reference to the drawings.

First Embodiment

Figure 1:
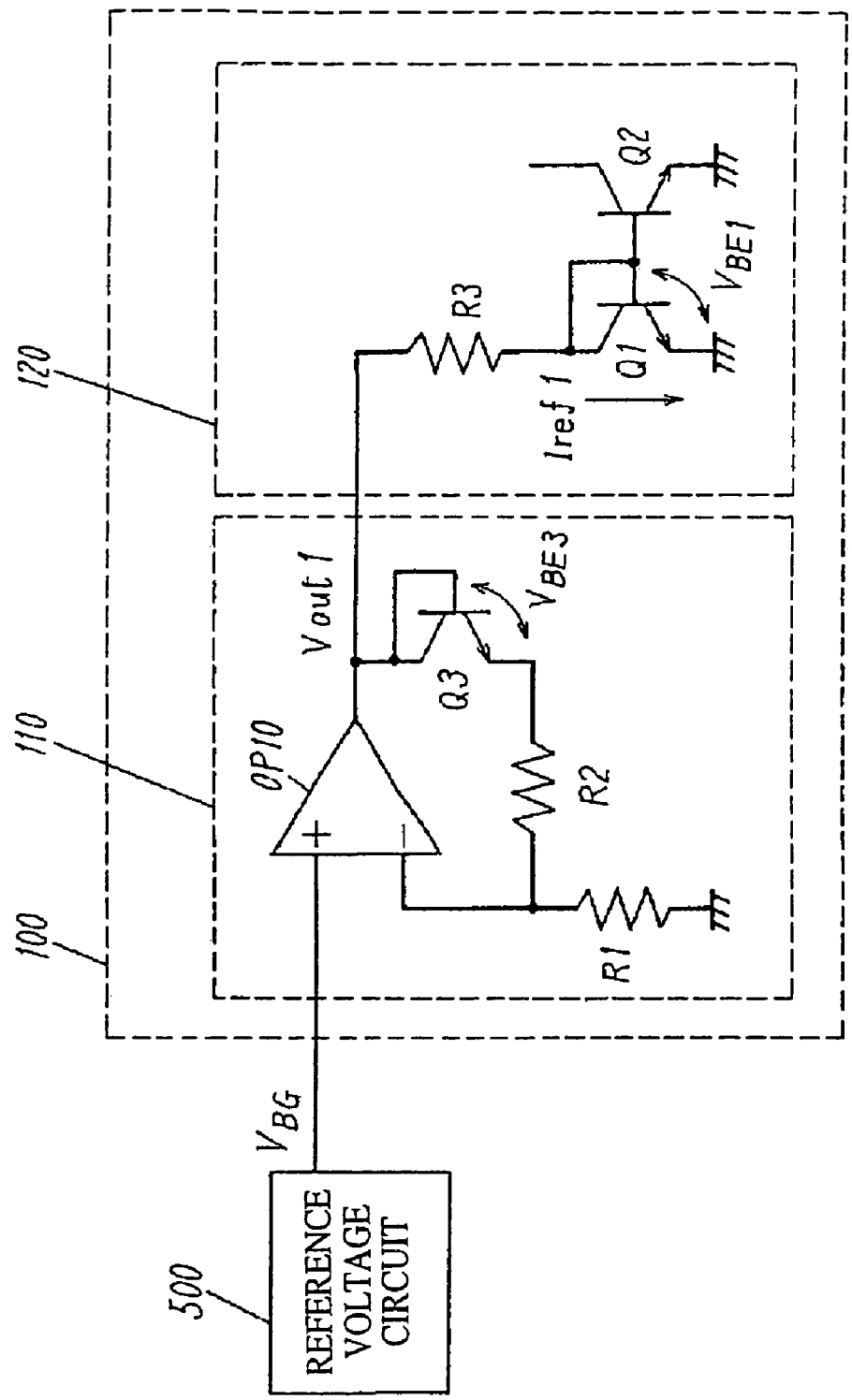
FIG. 1 shows a structure of a reference current circuit of a first embodiment of the present invention.

FIG. 1 shows a structure of a reference current circuit of a first embodiment of the present invention.

A reference current circuit 100 includes anon-inverting amplifier circuit 110 and the current source circuit 120 which receives input from the non-inverting amplifier circuit 110.

The non-inverting amplifier circuit 110 is composed of an amplifier circuit OP10, a resistor R1, a resistor R2, and a transistor Q3. The amplifier circuit OP10 has an inverting input terminal, a non-inverting input terminal, and an output terminal; the resistor R1 is inserted in a wiring connecting the inverting input terminal and a ground terminal; and the resistor R2 and the transistor Q3 which functions as a temperature-compensating element are inserted in a wiring connecting the output terminal and the inverting input terminal. The non-inverting input terminal of the amplifier circuit OP10 receives input of a reference voltage $V_{BG}$ which is independent of the temperature T and the power supply voltage Vdd. In other words, the reference voltage $V_{BG}$ is temperature-compensated.

Since the structures of the current source circuit 120 and the reference voltage circuit 500 are the same as those described in the prior art, their descriptions are omitted here.

Next, with regard to the above-structured reference current circuit 100 of the first embodiment, an outline of a-principle which generates a reference current with low temperature-dependence in a case where a temperature coefficient of resistance is substantially 0.

The following equation holds for the non-inverting amplifier circuit 110.

$$V_{BG} = \frac{R_1}{R_1 + R_2} \cdot (V_{out1} - V_{BE3}) \tag{1.1}$$

Based on the equation (1.1), an output voltage $V_{out1}$ of the non-inverting amplifier circuit is derived as follows:

$$V_{out1} = \left(1 + \frac{R_2}{R_1}\right) \cdot V_{BG} + V_{BE3} \tag{1.2}$$

where, $V_{BG}$ is a reference voltage which is independent of the temperature T and the power supply voltage Vdd; and $R_1$, $R_2$, and $R_3$ are resistances whose temperature coefficients are substantially 0. When the temperature is T, the following equations hold.

$$\frac{\partial V_{BG}}{\partial T} = 0, \frac{\partial R_1}{\partial T} = \frac{\partial R_2}{\partial T} = 0$$

Accordingly, although the first term in the right side of the equation (1.2) is independent of the temperature, $V_{BE3}$ is temperature-dependent. Also, the following equation holds for the current source circuit 120.

$$V_{out1} = R_3 \cdot I_{ref1} + V_{BE1} \tag{1.3}$$

Based on the equations (1.2) and (1.3), the following equation can be obtained.

$$R_3 \cdot I_{ref1} + V_{BE1} = \left(1 + \frac{R_2}{R_1}\right) \cdot V_{BG} + V_{BE3}$$

Hence, the following equation can be derived.

$$I_{ref1} = \frac{R_1 + R_2}{R_1 \cdot R_3} \cdot V_{BG} + \frac{V_{BE3} - V_{BE1}}{R_3} \tag{1.4}$$

Here, when $V_{BE3}$ and $V_{BE1}$ are equal or substantially equal, the second term in the right side of the equation (1.4) can be considered 0. That is to say, the following holds.

$$I_{ref1} \approx \frac{R_1 + R_2}{R_1 \cdot R_3} \cdot V_{BG} \qquad (1.5)$$

Here, when the resistance is expressed as follows;

$$f(R) \equiv \frac{R_1 + R_2}{R_1 \cdot R_3}$$

since $R_1$, $R_2$, and $R_3$ are resistances with temperature coefficients of substantially 0, the following equation holds.

$$\frac{\partial f(R)}{\partial T} = 0$$

Partially differentiating both sides of the equation (1.5) by the temperature T yields the following:

$$\frac{\partial I_{ref1}}{\partial T} = \frac{\partial f(R)}{\partial T} \cdot V_{BG} + f(R) \cdot \frac{\partial V_{BG}}{\partial T} = 0 \qquad (1.6)$$

The equation (1.6) indicates that a reference current $I_{ref1}$ is independent of the temperature T.

Consequently, the structure shown in FIG. 1 is capable of reducing the temperature-dependence of the reference current $I_{ref1}$.

As described above, the temperature characteristic of the transistor Q1 can be cancelled by inserting, on a negative feedback circuit of the non-inverting amplifier circuit 110, the transistor Q3 whose temperature characteristic is the same as that of the transistor Q1. In other words, the temperature dependence of the reference current $I_{ref1}$ can be eliminated or reduced.

Figure 6:
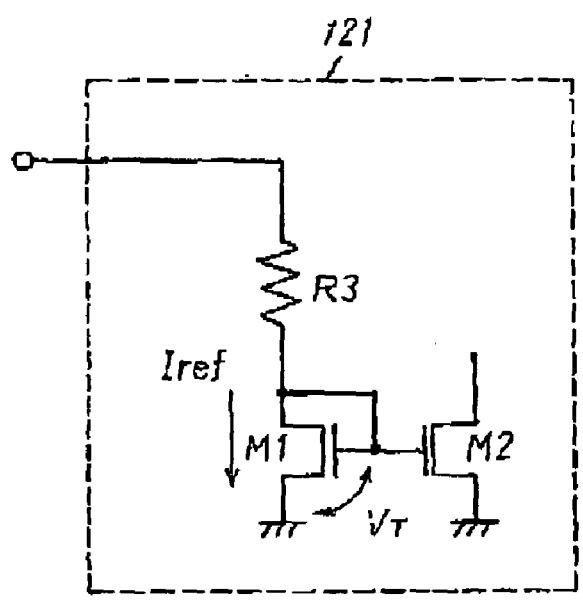
FIG. 6 shows a structure of a modification example of the first, second or third embodiment.

Note that while the transistors Q1 and Q2 are used in the current source circuit 120 of the first embodiment, MOS transistors M1 and M2 can be used as is the case with a current source circuit 121 shown in FIG. 6. In this case, it is preferable that MOS transistors with the same temperature characteristic as the MOS transistor M1 be used in place of the transistor Q3.

Also, while an NPN bipolar transistor is used as the transistor Q3 included in the non-inverting amplifier circuit 110, the transistor Q3 can be a diode-connected PNP bipolar transistor or a P-N junction diode, or can further be any device or a circuit of a similar temperature characteristic, as there are no particular limitations.

Second Embodiment

Figure 2:
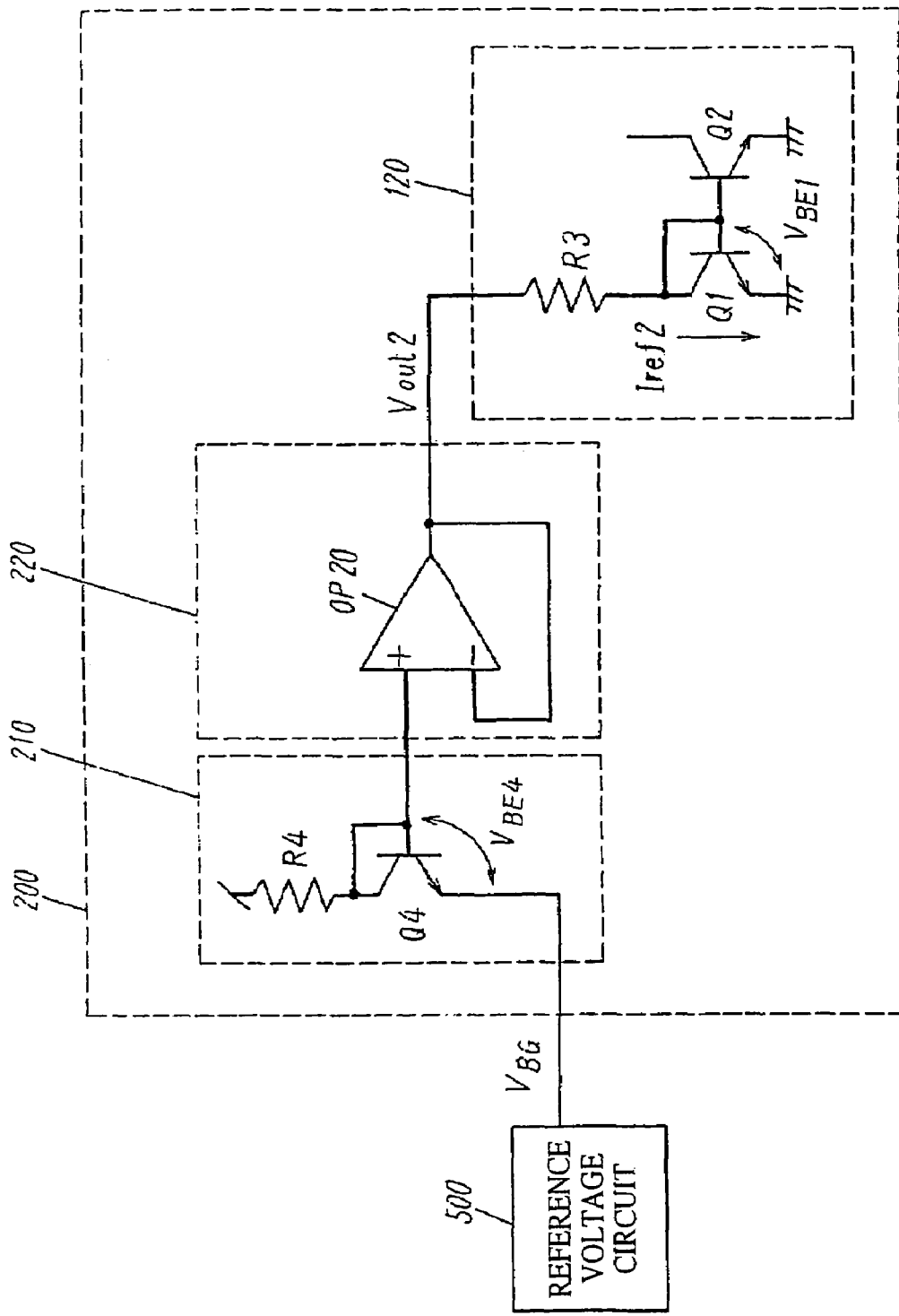
FIG. 2 shows a structure of a reference current circuit of a second embodiment of the present invention.

FIG. 2 shows a structure of a reference current circuit of a second embodiment of the present invention.

A reference current circuit 200 includes a temperature-compensating circuit 210, a voltage follower 220 which receives output from the temperature-compensating circuit 210 as input, and the current source circuit 120 which receives output from the voltage follower 220 as input.

The temperature-compensating circuit 210 is composed of a transistor Q4 and a resistor R4. The transistor Q4 receives input of the reference voltage $V_{BG}$ from an emitter thereof, and a collector and a base of the transistor Q4 are connected to each other. The resistor R4 is inserted in a wiring connecting a power supply terminal and the collector of the transistor Q4.

The voltage follower 220 is composed of an amplifier circuit OP20 which includes an inverting input terminal, a non-inverting input terminal, and an output terminal. The collector and the base of the transistor Q4 are connected to the non-inverting input terminal of the amplifier circuit OP20, and the output terminal and the inverting input terminal of the amplifier circuit OP20 are connected to each other.

Since the structures of the current source circuit 120 and the reference voltage circuit 500 are the same as those described in the prior art, their descriptions are omitted here.

Next, with regard to the above-structured reference current circuit 200 of the second embodiment, an outline of the principle which generates a reference current with low temperature-dependence in a case where a temperature coefficient of resistance is substantially 0.

An output voltage $V_{TC}$ of the temperature-compensating circuit 210 can be expressed as follows:

$$V_{TC} = V_{BG} + V_{BE4} \qquad (2.1)$$

Accordingly, an output voltage $V_{out2}$ of the voltage follower 220 can be expressed as follows:

$$V_{out2} = V_{BG} + V_{BE4} \qquad (2.2)$$

Also, for the current source circuit 120, the following equation holds, as is the case with the first embodiment.

$$V_{out2} = R_3 \cdot I_{ref2} + V_{BE1} \qquad (2.3)$$

Based on the equations (2.2) and (2.3), the following equation can be obtained.

$$R_3 \cdot I_{ref2} + V_{BE1} = V_{BG} + V_{BE4}$$

Thus, the following equation can be derived.

$$I_{ref2} = \frac{V_{BG} + V_{BE4} - V_{BE1}}{R_3} \qquad (2.4)$$

Here, when $V_{BE4}$ and $V_{BE1}$ are equal or substantially equal, the following equation holds.

$$I_{ref2} = \frac{V_{BG}}{R_3} \qquad (2.5)$$

Here, $V_{BG}$ is a reference voltage which is independent of the temperature T and the power supply voltage Vdd; and $R_3$ is a resistance whose temperature coefficient is substantially 0. Accordingly, when the temperature is T, the following equations hold.

$$\frac{\partial V_{BG}}{\partial T} = 0, \quad \frac{\partial R_3}{\partial T} = 0$$

Partially differentiating both sides of the equation (2.5) by the temperature T yields the following equation:

$$\frac{\partial I_{ref2}}{\partial T} = \frac{1}{R_3} \cdot \frac{\partial V_{BG}}{\partial T} - \frac{V_{BG}}{R_3^2} \cdot \frac{\partial R_3}{\partial T} = 0 \qquad (2.6)$$

The equation (2.6) indicates that a reference current $I_{ref2}$ is independent of the temperature T.

Consequently, the structure shown in FIG. 2 is capable of reducing temperature dependence of the reference current $I_{ref2}$.

As described above, the temperature characteristic of the transistor Q1 can be cancelled by inserting, on the temperature-compensating circuit 210, the transistor Q4 whose temperature characteristic is the same as that of the transistor Q1. In other words, the temperature dependence of the reference current $I_{ref2}$ can be eliminated or reduced.

Note that while the transistors Q1 and Q2 are used in the current source circuit 120 of the second embodiment, the MOS transistors M1 and M2 can be used as with the current source circuit 121 shown in FIG. 6. In this case, it is preferable that MOS transistors with the same temperature characteristic as the MOS transistor M1 be used in place of the transistor Q4.

Figure 7:
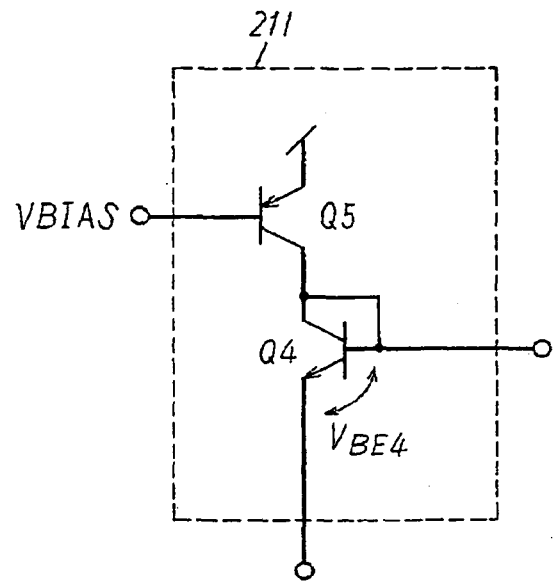
FIG. 7 shows a structure of a modification example of a temperature-compensated circuit of the second or third embodiment.
Figure 8:
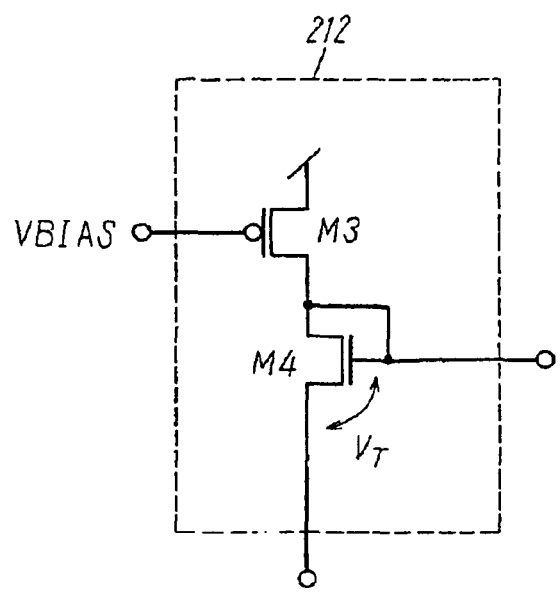
FIG. 8 shows a structure of a modification example using a MOS transistor of the temperature-compensated circuit of the second or third embodiment.

Also, while the resistor R4 is used in the temperature-compensating circuit 210, a PNP bipolar transistor whose base receives input of a bias voltage VBIAS can be used alternatively, as is the case with the temperature-compensating circuit 211 shown in FIG. 7. Additionally, as shown in FIG. 8, the temperature-compensating circuit 210 can be replaced with a temperature-compensating circuit 212 which employs MOS transistors M3 and M4.

Third Embodiment

Figure 3:
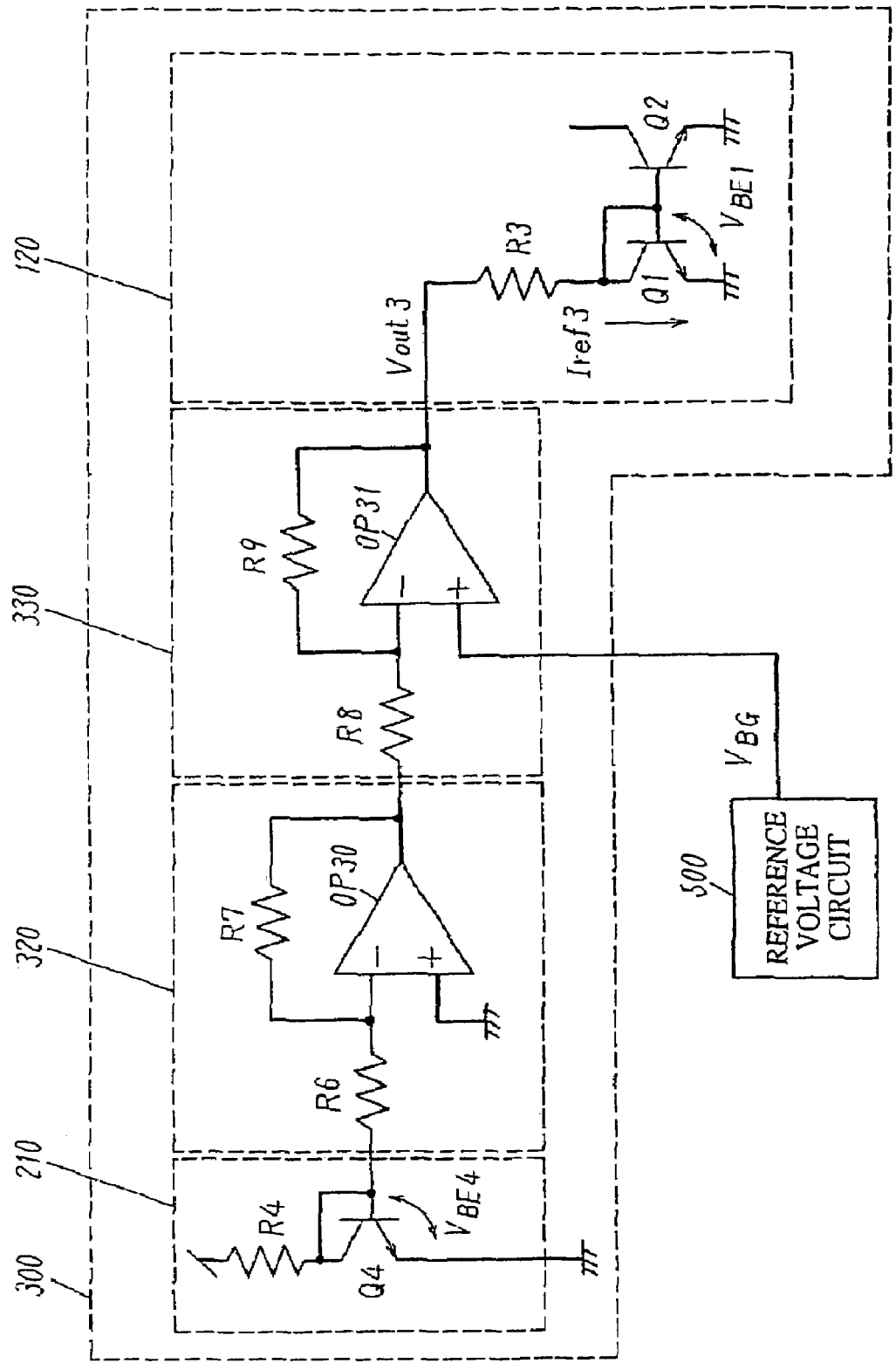
FIG. 3 shows a structure of a reference current circuit of a third embodiment of the present invention.
Figure 4:
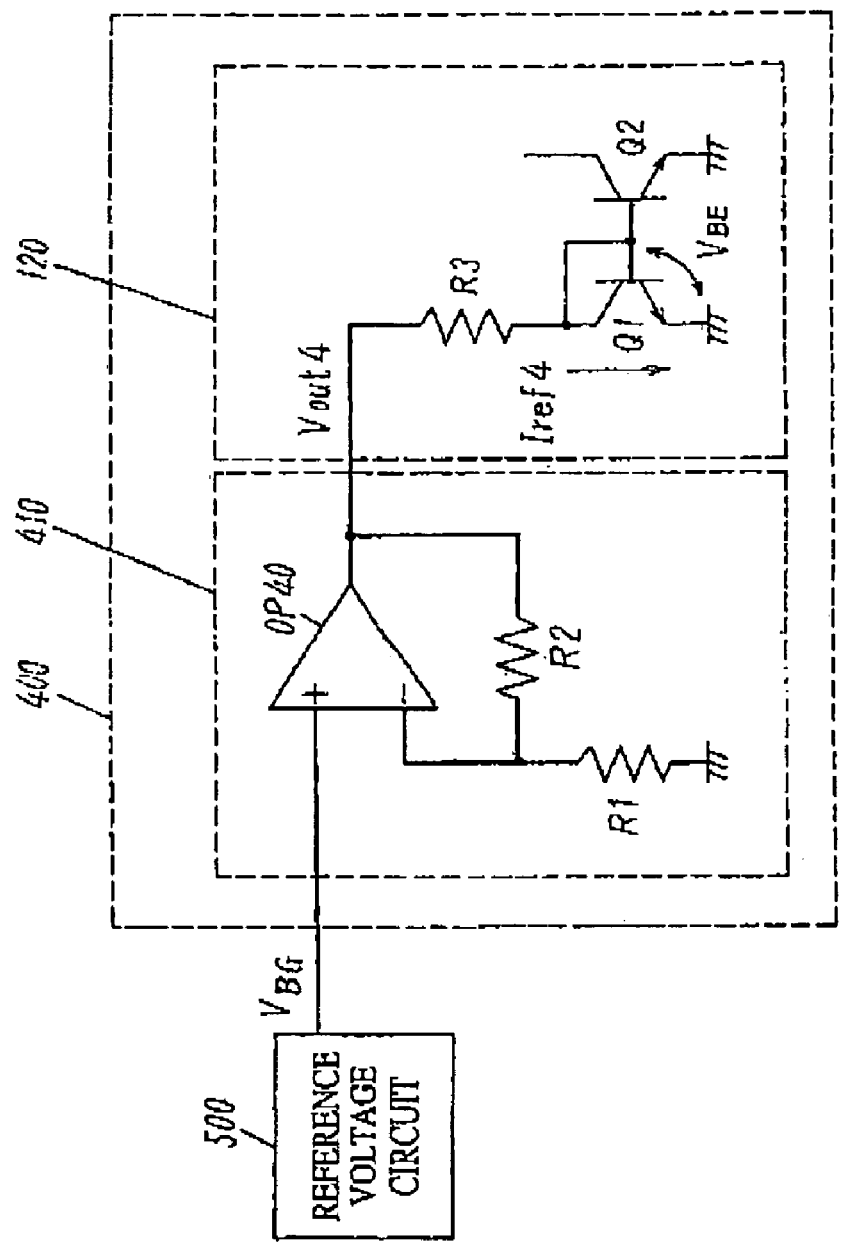
FIG. 4 shows a structure of a conventional reference current circuit.
Figure 5:
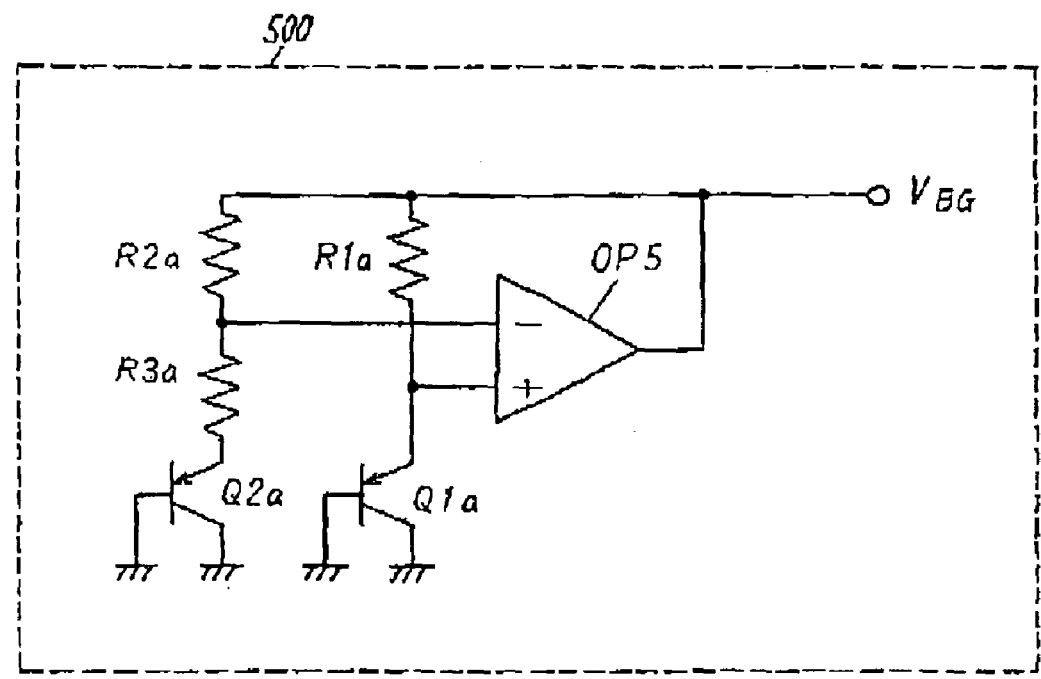
FIG. 5 shows a structure of a reference voltage circuit.

FIG. 3 shows a structure of a reference current circuit of a third embodiment of the present invention.

A reference current circuit 300 includes the temperature-compensating circuit 210, an inverting amplifier circuit 320, an inverting amplifier circuit 330, and the current source circuit 120. The inverting amplifier circuit 320 receives output from the temperature-compensating circuit 210 as input; the inverting amplifier circuit 330 receives output from the inverting amplifier circuit 320 as input; and the current source circuit 120 receives output from the inverting amplifier circuit 320 as input.

The temperature-compensating circuit 210 is composed of the transistor Q4 and the resistor R4. The emitter of the transistor Q4 is grounded, and the collector and the base of the transistor Q4 are connected to each other. The resistor R4 is inserted in a wiring connecting a power supply terminal and the collector of the transistor Q4.

The inverting amplifier circuit 320 is composed of an amplifier circuit OP30, a resistor R6, and a resistor R7. The amplifier circuit OP30 has an inverting input terminal, a non-inverting input terminal, and an output terminal, and the non-inverting input terminal of the amplifier circuit OP30 is connected to a ground terminal; the resistor R6 is inserted in a wiring connecting the inverting input terminal of the amplifier circuit OP30 and the output terminal of the temperature-compensating circuit 210; and the resistor R7 is inserted in a wiring connecting the output terminal and the inverting input terminal of the amplifier circuit OP30.

The inverting amplifier circuit 330 is composed of an amplifier circuit OP31, a resistor R8, and a resistor R9. The amplifier circuit OP31 has an inverting input terminal, a non-inverting input terminal, and an output terminal, and the non-inverting input terminal of the amplifier circuit OP31 receives input of the reference voltage $V_{BG}$; the resistor R8 is inserted in a wiring connecting the inverting input terminal of the amplifier circuit OP31 and the output terminal of the amplifier circuit OP30; and the resistor R9 is inserted in a wiring connecting the output terminal and the inverting input terminal of the amplifier circuit OP31.

Since the structures of the current source circuit 120 and the reference voltage circuit 500 are the same as those described in the prior art, their descriptions are omitted here.

Next, with regard to the above-structured reference current circuit 300 of the third embodiment, an outline of the principle which generates a reference current with low temperature dependence in the case where a temperature coefficient of resistance is substantially 0.

Output of the temperature-compensating circuit 210 is a voltage $V_{BE4}$, a base-emitter voltage of the transistor Q4.

Next, assume that an output voltage of the inverting amplifier circuit 320 is $V_{320}$, the following equation holds.

$$V_{320} = -\frac{R_7}{R_6} \cdot V_{BE4} \quad (3.1)$$

Furthermore, an output voltage $V_{out3}$ of the inverting amplifier circuit 330 can be expressed as follows:

$$V_{out3} = \frac{R_8 + R_9}{R_8} \cdot V_{BG} - \frac{R_9}{R_8} \cdot V_{320} \quad (3.2)$$
$$= \frac{R_8 + R_9}{R_8} \cdot V_{BG} - \frac{R_9}{R_8} \cdot \left(-\frac{R_7}{R_6} \cdot V_{BE4}\right)$$

Here, if $R=R_6=R_7=R_8=R_9$, $V_{out3}$ can be expressed as:

$$V_{out3} = 2 \cdot V_{BG} + V_{BE4} \quad (3.3)$$

Also, for the current source circuit 120, the following equation can be found, as is the case with the first embodiment.

$$V_{out3} = R_3 \cdot I_{ref3} + V_{BE1} \quad (3.4)$$

Based on the equations (3.4) and (3.5), the following equation can be found.

$$R_3 \cdot I_{ref3} + V_{BE1} = 2 \cdot V_{BG} + V_{BE4}$$

Hence, the equation can be rearranged as follows:

$$I_{ref3} = \frac{2 \cdot V_{BG} + V_{BE4} - V_{BE1}}{R_3} \quad (3.5)$$

Here, when $V_{BE4}$ and $V_{BE1}$ are equal or substantially equal, the following equation can be derived.

$$I_{ref3} = \frac{2 \cdot V_{BG}}{R_3} \quad (3.6)$$

Here, $V_{BG}$ is a reference voltage which is independent of the temperature T and the power supply voltage Vdd; and $R_3$ is a resistance with a temperature coefficient of substantially 0. Accordingly, when the temperature is T, the following equations hold.

$$\frac{\partial V_{BG}}{\partial T} = 0, \quad \frac{\partial R_3}{\partial T} = 0$$

Partially differentiating both sides of the equation (3.6) by the temperature T yields the following:

$$\frac{\partial I_{ref3}}{\partial T} = \frac{2}{R_3} \cdot \frac{\partial V_{BG}}{\partial T} - \frac{2 \cdot V_{BG}}{R_3^2} \cdot \frac{\partial R_3}{\partial T} = 0 \quad (3.7)$$

The equation (3.7) indicates that a reference current $I_{ref3}$ is independent of the temperature T.

Consequently, the structure shown in FIG. 3 is capable of reducing temperature dependence of the reference current $I_{ref3}$.

As described above, the temperature characteristic of the transistor Q1 can be cancelled by using, on the temperature-compensating circuit 210, the transistor Q4 whose temperature characteristic is the same as that of the transistor Q1. In other words, the temperature dependence of the reference current $I_{ref3}$ can be eliminated or reduced.

Note that while in the above description, the resistance values are assumed to be $R=R_6=R_7=R_8=R_9$, the resistance values can be $R_6=R_9$ and $R_7=R_8$.

Also, while the transistors Q1 and Q2 are used in the current source circuit 120 of the third embodiment, the MOS transistors M1 and M2 can be used as is the case with the current source circuit 121 shown in FIG. 6. In this case, it is preferable that MOS transistors with the same temperature characteristic as the MOS transistor M1 be used in place of the transistor Q4.

In addition, while the resistor R4 is used in the temperature-compensating circuit 210, a PNP bipolar transistor whose base receives input of a bias voltage VBIAS can be used alternatively, as is the case with the temperature-compensating circuit 211 shown in FIG. 7. Additionally, as shown in FIG. 8, the temperature-compensating circuit 210 can be replaced with the temperature-compensating circuit 212 which employs the MOS transistors M3 and M4.

Also, a resistor can be connected between the non-inverting input terminal of the inverting amplifier circuit 320 and the ground terminal.

While the embodiments of the present invention have been described in detail as above, the present invention is not limited to the above-described embodiments. The inverting amplifier circuit 110 of the first embodiment, the temperature-compensating circuit 210 and the voltage follower 220 of the second embodiment, and the temperature-compensating circuit 210 and the inverting amplifier circuits 320 and 330 of the third embodiment, respectively, can be considered to be a voltage generating circuit whose output voltage $V_{out}$ satisfies a relational expression "$V_{out}=\alpha \times V_{BG}+V_{BE}$". Any voltage generating circuit which satisfies the above relational expression can achieve, regardless of the circuit structure, effects equivalent to those achieved by the above-mentioned embodiments. It should be noted here that $\alpha$ is an arbitrary coefficient which has an extremely low temperature dependence, and $V_{BE}$ is a voltage across terminals of a semiconductor device which is equivalent, in temperature characteristic, to a semiconductor device included in the current source circuit 120. Here, the semiconductor device can be a diode-connected bipolar transistor, a P-N junction diode, or a diode-connected MOS transistor. Also, the voltage across the terminals can be, for instance in a case of a bipolar transistor, a base-emitter voltage (this can also be referred to as a collector-emitter voltage due to the diode-connection).

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A reference current circuit comprising:
   a voltage generating circuit configured to generate, from a reference voltage which is temperature-compensated, a predetermined voltage at an output point; and
   a current source circuit including a current mirror composed of a first semiconductor device connected to the output point via a resistor and a second semiconductor device which, as a result of receiving a voltage equal to a voltage across terminals of the first semiconductor device, generates a current corresponding to the received voltage, wherein:
   the voltage generating circuit (i) includes a third semiconductor device, a voltage across terminals of which has a temperature characteristic identical to the temperature characteristic of the voltage across the terminals of the first semiconductor device, an amplifier circuit, a first resistor, and a second resistor, the amplifier circuit having an inverting input terminal, a non-inverting input terminal, and an output terminal, and (ii) is configured such that (a) the reference voltage is input to the non-inverting input terminal, (b) a voltage at the output terminal is output as the predetermined voltage, (c) the first resistor is inserted in a first wiring connecting the inverting input terminal and a ground terminal, (d) the second resistor is inserted in a second wiring connecting the output terminal and the inverting input terminal, and (e) the third semiconductor device is inserted in the second wiring.

2. The reference current circuit of claim 1, wherein the voltage generating circuit is composed of a non-inverting amplifier circuit, a feedback path of which includes the third semiconductor device therein.

3. The reference current circuit of claim 1, wherein the first and the third semiconductor devices are both diode-connected bipolar transistors.

4. The reference current circuit of claim 1, wherein the first and the third semiconductor devices are both P-N junction diodes.

5. The reference current circuit of claim 1, wherein the first and the third semiconductor devices are both diode-connected MOS transistors.

6. A reference current circuit comprising:
   a voltage generating circuit operable to generate, from a reference voltage which is temperature-compensated, a predetermined voltage at an output point; and
   a current source circuit including a current mirror composed of a first semiconductor device connected to the output point via a resistor and a second semiconductor device which, as a result of receiving a voltage equal to a voltage across terminals of the first semiconductor device, generates a current corresponding to the received voltage, wherein:
   the voltage generating circuit (i) includes a third semiconductor device, a voltage across terminals of which has a temperature characteristic identical to the temperature characteristic of the voltage across the terminals of the first semiconductor devices,
   a voltage follower and a resistor, and (ii) is configured such that (a) the resistor is inserted in a wiring connecting a power supply terminal and an input point of the voltage follower, (b) the third semiconductor device is inserted in a wiring connecting a receiving point of the reference voltage and the input point of the voltage follower, and (c) a voltage at an output point of the voltage follower is output as the predetermined voltage.

7. The reference current circuit of claim 6, wherein
the first and the third semiconductor devices are both diode-connected bipolar transistors.

8. The reference current circuit of claim 6, wherein
the first and the third semiconductor devices are both P-N junction diodes.

9. The reference current circuit of claim 6, wherein
the first and the third semiconductor devices are both diode-connected MOS transistors.

10. The reference current circuit of claim 6, wherein
the resistor is one of (i) a bipolar transistor, a base of which receives a bias voltage input, and (ii) a MOS transistor, a gate of which receives a bias voltage input.

11. A reference current circuit comprising:
a voltage generating circuit operable to generate, from a reference voltage which is temperature-compensated, a predetermined voltage at an output point; and
a current source circuit including a current mirror composed of a first semiconductor device connected to the output point via a ,resistor and a second semiconductor device which, as a result of receiving a voltage equal to a voltage across terminals of the first semiconductor device generates a current corresponding to the received voltage, wherein:
the voltage generating circuit (i) includes a third semiconductor device, a voltage across terminals of which has a temperature characteristic identical to the temperature characteristic of the voltage across the terminals of the first semiconductor device,
a first inverting amplifier circuit, a second inverting amplifier circuit, and a resistor, and (ii) is configured such that (a) the resistor and the third semiconductor device are sequentially inserted in a wiring connecting from a power supply terminal to a ground terminal, (b) a voltage at a middle point between the resistor and the third semiconductor device on the wiring is input to the first inverting amplifier circuit, (c) an output voltage of the first inverting amplifier circuit is input to the second inverting amplifier circuit, (d) an output voltage of the second inverting amplifier circuit is output as the predetermined voltage, (e) a ground voltage is input to a non-inverting input terminal of the first inverting amplifier circuit, and (f) the reference voltage is input to a non-inverting input terminal of the second inverting amplifier circuit.

12. The reference current circuit of claim 11, wherein
the first and the third semiconductor devices are both diode-connected bipolar transistors.

13. The reference current circuit of claim 11, wherein
the first and the third semiconductor devices are both P-N junction diodes.

14. The reference current circuit of claim 11, wherein
the first and the third semiconductor devices are both diode-connected MOS transistors.

15. The reference current circuit of claim 11, wherein
the resistor is one of (i) a bipolar transistor, a base of which receives a bias voltage input, and (ii) a MOS transistor, a gate of which receives a bias voltage input.

* * * * *